United States Patent [19]
You

[11] Patent Number: 6,111,779
[45] Date of Patent: Aug. 29, 2000

[54] CELL STRUCTURE FOR LOW ELECTRIC POWER STATIC RAM

[75] Inventor: Min-Young You, Choongcheongbuk-Do, Rep. of Korea

[73] Assignee: LG Semicon Co., Ltd., Cheongju, Rep. of Korea

[21] Appl. No.: 09/304,643

[22] Filed: May 4, 1999

[30] Foreign Application Priority Data

May 7, 1998 [KR] Rep. of Korea ...................... 98-16259

[51] Int. Cl.[7] .............................. G11C 11/00; G11C 7/00
[52] U.S. Cl. .................... 365/154; 365/189.09; 365/227; 365/229
[58] Field of Search ..................................... 365/154, 156, 365/226, 227, 228, 229, 189.09, 189.11

[56] References Cited

U.S. PATENT DOCUMENTS

| | | | |
|---|---|---|---|
| 5,189,316 | 2/1993 | Murakami et al. | 307/296.1 |
| 5,491,661 | 2/1996 | Motomura | 365/230.01 |
| 5,581,500 | 12/1996 | D'Souza | 365/154 |
| 5,600,588 | 2/1997 | Kawashima | 365/154 |
| 5,734,622 | 3/1998 | Furumochi et al. | 365/233.5 |
| 5,991,191 | 11/1999 | Rao | 365/154 |

*Primary Examiner*—Son Mai
*Attorney, Agent, or Firm*—Fleshner & Kim, LLP

[57] ABSTRACT

A cell structure for a low electric power static RAM is disclosed and includes a data retention voltage detector for detecting a data retention voltage, a cell load controller for controlling a cell voltage, a load resistor, an access NMOS transistor, and a drive NMOS transistor.

19 Claims, 3 Drawing Sheets

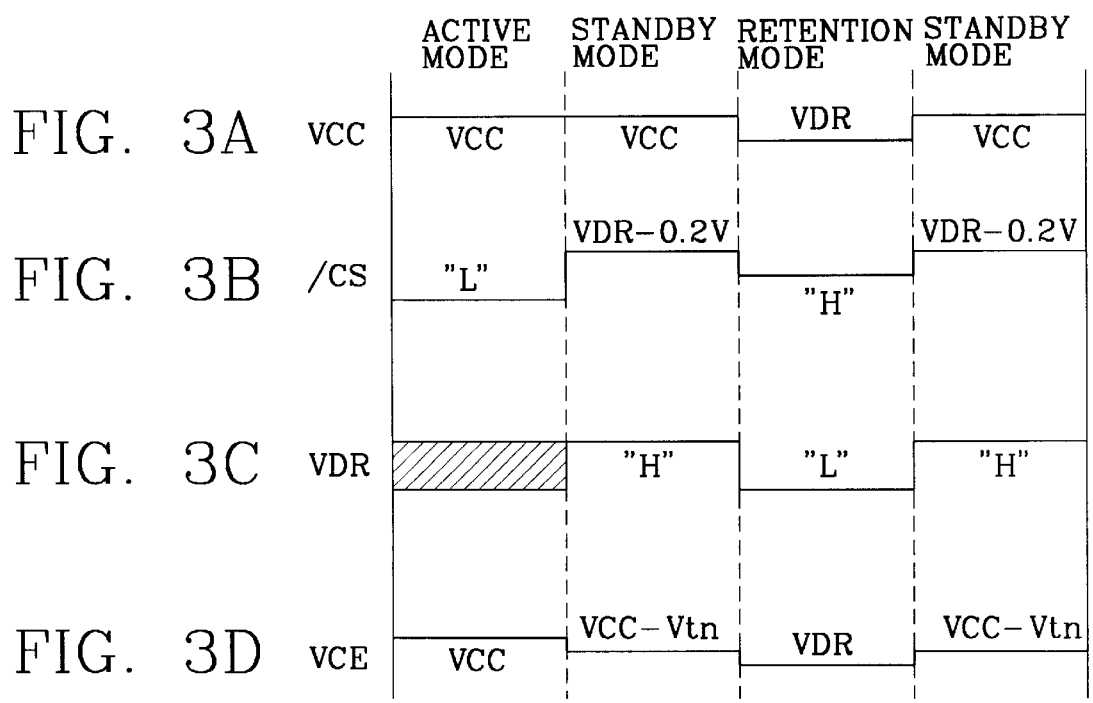

CELL STRUCTURE FOR LOW ELECTRIC POWER STATIC RAM

BACKGROUND OF THE INVENTION

1. Field of the Invention

The present invention relates to a cell structure for a low electric power memory device, and in particular to a cell structure for a low electric power static RAM.

2. Background of the Related Art

As shown in FIG. 1, a related art low electric power static RAM (SRAM) includes a cell 1 having access NMOS transistors NM1 and NM3, the gates of which are connected with a word line and the sources of which are connected with a bit line, and drive NMOS transistors NM2 and NM4, the gates of which are connected with the drains of the access NMOS transistors NM1 and NM3 and the drains of which are connected with a ground voltage. The cell 1 of a load resistance static RAM also has load resistors RL1 and RL2 connected with the sources of the drive NMOS transistors NM2 and NM4. A step down voltage generator 2 applies a cell voltage VCE to the cell 1, and a standby mode detector 3 detects the mode of the step down voltage generator 2.

The operation of the related art cell structure for a low electric power static RAM (SRAM) will now be described. First, in the standby mode, if the word line is set at a low level, the access NMOS transistors NM1 and NM3 are turned off, and the drive NMOS transistors NM2 and NM4 are turned on or turned off. At this time, the cell voltage VCE is applied to the cell node via the resistors RL1 and RL2, and the current flows to the ground voltage VSS by the turn-on current of the drive NMOS transistors. The current flowing to the ground VSS through the load resistors RL1 and RL2 and the drive NMOS transistors NM2 and NM4 is called a standby current.

In addition, if the cell voltage VCE is a step down voltage VSD, the step down voltage generator 2 is driven by the standby mode detector 3, and the cell voltage VCE is decreased, which decreases the standby current of the cell.

In the retention mode, if the word line is set at a low level, the access NMOS transistors NM1 and NM3 are turned off, and the drive NMOS transistors NM2 and NM4 are turned on or turned off. The data retention voltage VDR, which is a battery backup voltage lower than 2.0V, flows to the cell voltage node via the load resistors RL1 and RL2 as a cell voltage VCE. At the same time, the leakage current of the drive NMOS transistors NM2 and NM4 of the cell flows to the ground by the leakage current.

As described above, the related art SRAM has various disadvantages. If the leakage current flowing via the drive NMOS transistors NM2 and NM4 is higher than the current from the load resistors RL1 and RL2, the high node voltage of the cell is decreased, and the data of the cell may be varied due to the cell characteristic of a latch type static RAM (SRAM). In addition, since there is no control circuit for the data retention mode and the signal is set at a high level in the data retention mode, the standby mode detector 3 is operated, and the cell voltage VCE is decreased to the step down voltage VSD, thereby deteriorating the data retention voltage characteristic of the cell.

In the related art cell structure of the static RAM (SRAM), since there is a cell voltage VCC applied to the memory cell in the standby mode, if the resistance values of the load resistors RL1 and RL2 are decreased during the processes, the standby current may be sharply increased. If the resistance values of the load resistors RL1 and RL2 are increased to decrease the standby current, the width and thickness are decreased based on the characteristic of the load poly forming the load resistors RL1 and RL2. In this case, the load resistors RL1 and RL2 may be open and may cause a low yield. Further, if the resistance values of the load resistors RL1 and RL2 are too high, the current flow to the cell voltage VCE via the load resistors RL1 and RL2 is decreased, and the characteristic of the data retention voltage may deteriorate. In addition, since there is no data retention control circuit, the cell voltage VCE is decreased in the retention mode for thereby deteriorating the characteristic of the data retention voltage.

The above references are incorporated by reference herein where appropriate for appropriate teachings of additional or alternative details, features and/or technical background.

SUMMARY OF THE INVENTION

An object of the present invention is to provide a memory device that substantially overcomes at least one of the aforementioned problems caused by disadvantages in the related art.

Another object of the present invention is to provide a cell structure for a RAM that decreases a standby current flowing at the cell in the standby mode.

Another object of the present invention is to provide a cell structure for a low electric power static RAM that prevents an increase of the data retention voltage in the data retention mode.

Another object of the present invention is to provide a cell structure for a low electric power static RAM that prevents any variation of a read/write characteristic of a cell data in the active mode.

Another object of the present invention is to provide a cell structure for a low electric power static RAM that prevents an opening of a load poly.

Another object of the present invention is to provide a memory device that decreases a standby current of a cell using a load control circuit in the standby mode and controls a data retention voltage using a data retention voltage detection circuit and a load control circuit in the data retention mode.

To achieve at least the above objects in a whole or in parts, there is provided a cell structure for a low electric power static RAM that includes a data retention voltage detector for detecting a data retention voltage, a cell load controller for controlling a cell voltage, a load resistor, an access NMOS transistor, and a drive NMOS transistor.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 3A through 3D are diagrams illustrating operational timing of the cell structure of FIG. 2.

DETAILED DESCRIPTION OF PREFERRED EMBODIMENTS

Figure 1:
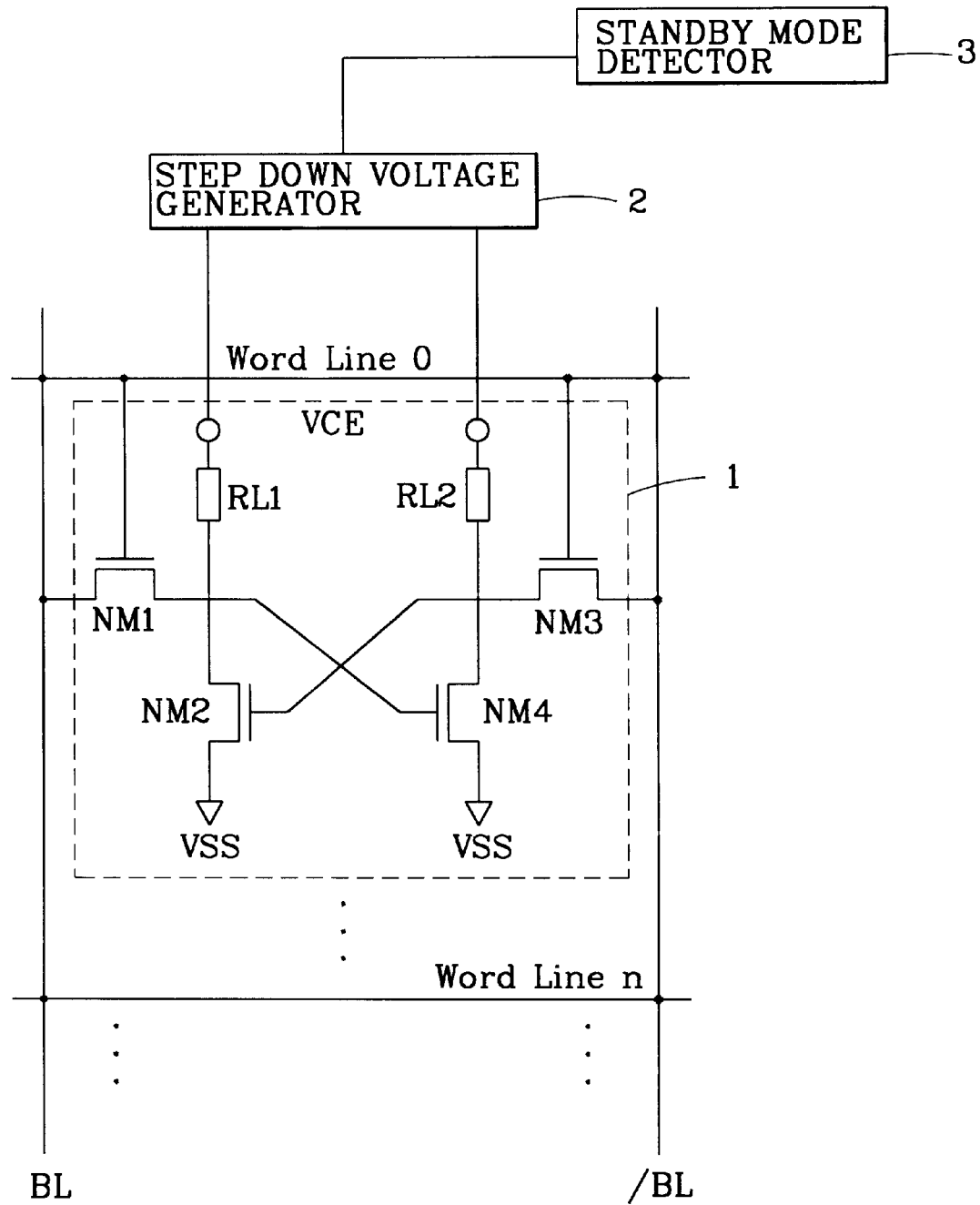
FIG. 1 is a diagram illustrating a cell structure for a related art low electric power static RAM.
Figure 2:
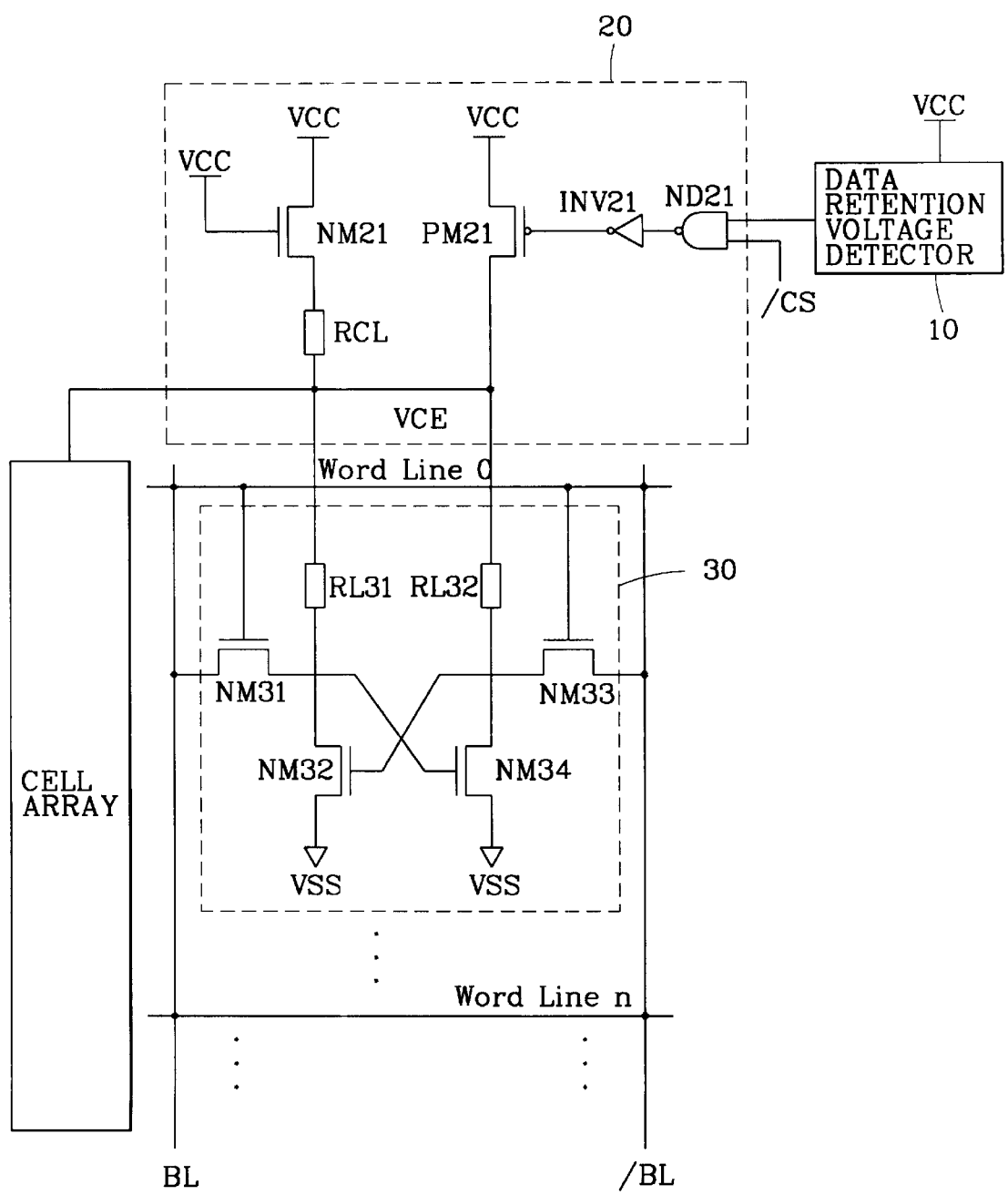
FIG. 2 is a diagram illustrating a cell for a preferred embodiment of a low electric power static RAM according to the present invention.

A cell structure for a preferred embodiment of a low electric power static RAM according to the present invention includes a cell 30 of a load resistance static RAM having a data retention voltage detector 10 for detecting a data retention voltage, and a load controller 20 for controlling a cell voltage VCE. The cell 30 preferably includes load resistors RL31 and RL32, access NMOS transistors NM31 and NM33, and a drive NMOS transistors NM32 and NM34.

The load controller 20 preferably includes a NAND-gate ND21 for NANDing a data retention mode signal VDR from a low electric power mode detection circuit and an inverted signal /CS of a chip selection signal, and an inverter INV21 for inverting the output signal from the NAND-gate ND21. A PMOS transistor PM21 has a source that receives an external voltage VCC and a drain that outputs a cell voltage VCE. A NMOS transistor NM21 has a gate and a drain that receive an external voltage, and a current limit resistor RCL coupled to the source of the NMOS transistor NM21 for outputting the cell voltage VCE.

Operations of the cell structure for a low electric power static RAM according to the preferred embodiment will now be described with reference to FIGS. 3A through 3D. In the standby mode, the inverted signal /CS of the chip selection signal is set at a VDR-0.2V, and the data retention voltage VDR is set at a high level, and the PMOS transistor PM21 of the load controller 20 is turned off.

Therefore, the cell voltage VCE is obtained by subtracting the threshold voltage Vtn of the NMOS transistor NM21 from the external voltage VCC, and the standby current of the cell is decreased by the cell voltage VCE and the current limit resistor.

In the data retention mode, the inverted signal /CS of the chip selection signal is set at a high level, and the data retention voltage VDR is set at a low level, and the PMOS transistor PM21 of the load controller 20 is turned on. Therefore, the cell voltage VCE becomes an external voltage VCC and the cell operates normally. Namely, the operation is not affected by the data retention voltage VDR.

In the active mode, the inverted signal /CS of the chip selection signal is set at a low level, and the PMOS transistor PM21 of the load controller 20 is turned on irrespective of the data retention voltage VDR. The cell voltage VCE becomes an external voltage VCC, and the cell operates normally. Namely, the operation is not affected by the cell read/write operation.

As described above, the preferred embodiment of the cell structure of a low power memory device has various advantages. In the standby mode, the cell voltage is obtained by subtracting the threshold voltage of a transistor from an external voltage, and then the cell voltage is applied to the cell via the current limit resistor RCL. Therefore, it is possible to decrease the standby current flowing in the cell in the standby mode.

In addition, in the data retention mode, since the cell voltage is supplied as an external voltage, the cell can be set at a given value to prevent deterioration of the data retention voltage characteristics of the cell. In the active mode, since the cell voltage is supplied as an external voltage, it is possible to prevent a predetermined variation in the read/write characteristic of the cell data that occurs when the cell voltage is decreased in the active mode. Since the standby current is decreased by controlling the cell voltage, it is possible to prevent an opening of a load poly that can occur when lowering the load poly for decreasing the load resistance value.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A memory device, comprising:
   a cell load controller that receives first and second control signals;
   at least one cell of a memory array coupled to said cell load controller to receive a first voltage in a first mode, a reduced voltage in a second mode and a second voltage in a third mode.

2. The memory device of claim 1, further comprising a voltage detector that detects a data retention voltage and outputs the first control signal, wherein the first mode is an active mode, the second mode is a standby mode, and the third mode is a data retention mode.

3. The memory device of claim 1, wherein the first voltage is a supply voltage, the reduced voltage is the supply voltage dropped through an active element, and the second voltage is the supply voltage.

4. The memory device of claim 2, wherein said cell load controller comprises:
   a first logic gate that logically processes the control signals;
   a second logic gate that logically processes an output of said first logic gate;
   a first transistor having a control electrode coupled to said second logic gate, and a first electrode coupled to the first voltage, and a second electrode coupled to an output terminal;
   a second transistor having a control electrode and a first electrode coupled to the first voltage; and
   a resistor coupled between a second electrode of said second transistor and the output terminal, wherein the output terminal is coupled to the at least one cell.

5. The memory device of claim 4, wherein the memory array is matrix type accessed by a plurality of bitlines and wordlines, wherein each of the at least one cell comprises:
   a pair of access elements;
   a pair of load elements; and
   a pair of drive elements.

6. The memory device of claim 5, wherein each of said pair of load elements are resistors coupled to the cell load controller, wherein each of said pair of drive elements are transistors having second electrodes coupled to a third voltage, first electrodes coupled to a respective one of the load resistors, and each of said pair of access elements are transistors having control electrodes coupled to a wordline, first electrodes coupled to a respective one of a bitline pair, and second electrodes coupled to control electrodes of a respective one of the drive transistors.

7. The memory device of claim 6, wherein the control signals are a control signal from a data retention voltage detector and chip select signal signal.

8. The memory device of claim 1, wherein said cell load controller comprises:
   a first logic gate that logically processes the control signals;

a second logic gate that logically processes an output of said first logic gate;

a first transistor having a control electrode coupled to said second logic gate, and a first electrode coupled to the first voltage, and a second electrode coupled to an output terminal; and a second transistor having a control electrode and a first electrode coupled to the first voltage.

9. The memory device of claim 8, further comprising a resistor coupled between a second electrode of said second transistor and the output terminal, wherein the output terminal is coupled to the at least one cell, wherein the control signals to said first logic gate are a data retention signal and a chip selection signal.

10. The memory device of claim 9, wherein said first and second transistors are PMOS and NMOS transistors respectively, wherein the first, second, and control electrodes are drain, source, and gate electrodes respectively, wherein said first logic gate is a NAND gate, and wherein said second logic gate is an inverter.

11. The memory device of claim 1, wherein the memory device is formed of one circuit on a single substrate.

12. A cell structure for a memory device, comprising:

a data retention voltage detector that outputs a first control signal;

a memory array having a matrix form of cells; and a cell load controller that receives the first control signal and a second control signal, detects one of three operational modes, and outputs one of three control voltages to the memory array.

13. The cell structure for a memory device of claim 12, wherein said cell load controller comprises:

a first logic gate that logically combines the first and second control signals;

a second logic gate that receives the output of said first logic gate;

a first transistor, having a control electrode, a first electrode, and a second electrode, wherein the control electrode receives an output signal from said second logic gate and the second electrode receives a first prescribed voltage, and the first electrode is coupled to said memory array;

a second transistor, having a control electrode and a first electrode, wherein the control electrode and the first electrode receive a supply voltage; and a current limit resistor connected to a second electrode of said second transistor and coupled to said memory array.

14. The cell structure of claim 13, wherein said first logic gate is a NAND gate and said second logic gate is an inverter, and wherein said first and second transistors are PMOS and NMOS transistors respectively, wherein the first, second, and control electrodes are drain, source, and gate electrodes respectively.

15. The cell structure of claim 12, wherein the second control signal received by said first logic gate is an inverted chip selection signal.

16. The cell structure of claim 12, wherein the cells of said memory matrix comprise:

a load element;

an access element; and a drive element.

17. The memory device of claim 16, wherein said load element comprises a first and second resistor, each having a first electrode coupled to said cell load controller, wherein said drive element comprises a third and fourth transistor, each having a second electrode coupled to a second prescribed voltage and a first electrode coupled to a respective second electrode of the first and second resistors, and wherein said access element comprises a fifth and sixth transistor, each having a control electrode coupled to a wordline, a first electrode coupled to a respective one of a bitline pair, and a second electrode coupled to a control electrode of a respective one of the third and fourth transistors.

18. The cell structure of claim 12, wherein said data retention voltage detector is formed of one circuit in a chip, and wherein said load controller applies the first prescribed voltage to a cell voltage node when the first control signal is low.

19. A method for operating a memory device, comprising:

detecting a data retention voltage;

logically combining a data retention voltage signal and a control signal to determine one of three chip modes;

load controlling cells of the memory device by applying a first voltage in an active mode, a second voltage in a data retention mode, and a third voltage in a standby mode.

* * * * *